(12) United States Patent
Boswell et al.

(10) Patent No.: US 8,405,043 B2
(45) Date of Patent: Mar. 26, 2013

(54) CHARGED PARTICLE EXTRACTION DEVICE AND METHOD OF DESIGN THERE FOR

(75) Inventors: Roderick Boswell, O'Connor (AU); Orson Sutherland, Leiden (NL)

(73) Assignee: FEI Company, Hillsboro, OR (US)

( * ) Notice: Subject to any disclaimer, the term of this patent is extended or adjusted under 35 U.S.C. 154(b) by 70 days.

(21) Appl. No.: 12/987,396

(22) Filed: Jan. 10, 2011

(65) Prior Publication Data
US 2011/0100798 A1 May 5, 2011

Related U.S. Application Data (63) Continuation of application No. 10/588,981, filed as application No. PCT/US2004/034984 on Oct. 16, 2004, now Pat. No. 7,872,242.

(30) Foreign Application Priority Data

Oct. 17, 2003 (AU) ................. 2003905709

(51) Int. Cl.
*G21K 1/08* (2006.01)
*H01J 3/14* (2006.01)
*H01J 3/26* (2006.01)
*H01J 49/42* (2006.01)

(52) U.S. Cl. ........... 250/396 R; 250/424; 250/423 R; 250/492.3; 250/310; 250/398; 250/309; 315/111.81; 204/192.11

(58) Field of Classification Search .............. 250/424, 250/423 R, 396 R, 492.3, 210; 315/111.81; 204/192.11
See application file for complete search history.

(56) References Cited

U.S. PATENT DOCUMENTS

| | | | |
|---|---|---|---|
| 4,362,632 A | 12/1982 | Jacob |
| 4,503,329 A | 3/1985 | Yamaguchi et al. |
| 4,859,908 A | 8/1989 | Yoshida et al. |
| 4,870,284 A | 9/1989 | Hashimoto et al. |
| 4,942,339 A | 7/1990 | Hershcovitch et al. |
| 5,036,252 A | 7/1991 | Lob |
| 5,108,535 A | 4/1992 | Ono et al. |
| 5,573,595 A | 11/1996 | Dible |
| 5,614,711 A | 3/1997 | Li et al. |
| 5,686,796 A | 11/1997 | Boswell et al. |
| 5,945,677 A | 8/1999 | Leung et al. |
| 6,127,275 A | 10/2000 | Flamm |
| 6,239,404 B1 | 5/2001 | Lea et al. |

(Continued)

FOREIGN PATENT DOCUMENTS

| JP | 58056332 | 4/1983 |
|---|---|---|
| JP | 59160941 | 9/1984 |

(Continued)

OTHER PUBLICATIONS

Guharay,S.K., Wang,W.,Dudnikov,V.G., Reiser, M., Orloff, J., Meingalis, J."High-brightness on source for ion projection lithography", J Vac Sci Tecnology B 14 (6), pp. 3907-3910, 1996.*

(Continued)

*Primary Examiner* — Jack Berman
*Assistant Examiner* — Meenakshi Sahu
(74) *Attorney, Agent, or Firm* — Scheinberg & Associates, PC; Michael O. Scheinberg; John B. Kelly (57) ABSTRACT

The present invention provides a method for extracting a charged particle beam from a charged particle source. A set of electrodes is provided at the output of the source. The potentials applied to the electrodes produce a low-emittance growth beam with substantially zero electric field at the output of the electrodes.

12 Claims, 4 Drawing Sheets

U.S. PATENT DOCUMENTS

| | | |
|---|---|---|
| 6,768,120 B2 | 7/2004 | Leung et al. |
| 6,770,836 B2 | 8/2004 | Kwon et al. |
| 6,833,051 B2 | 12/2004 | Kazumi et al. |
| 6,975,072 B2 | 12/2005 | Leung et al. |
| 7,084,407 B2 | 8/2006 | Ji et al. |
| 7,176,469 B2 | 2/2007 | Leung et al. |
| 7,241,361 B2 | 7/2007 | Keller et al. |
| 2001/0045525 A1* | 11/2001 | Gerlach et al. ............ 250/492.1 |
| 2006/0272775 A1 | 12/2006 | Horsky et al. |
| 2007/0108395 A1 | 5/2007 | Horsky et al. |
| 2010/0044580 A1 | 2/2010 | Boswell et al. |

FOREIGN PATENT DOCUMENTS

| | | |
|---|---|---|
| JP | 63165750 | 10/1988 |
| JP | 01132033 | 5/1989 |
| JP | 02065033 | 3/1990 |
| JP | 03272549 | 12/1991 |
| JP | 05041294 | 2/1993 |
| JP | 06176725 | 6/1994 |
| JP | 07320670 | 8/1995 |
| JP | 07312201 | 11/1995 |
| JP | 07335163 | 12/1995 |
| JP | 2000048763 | 2/2000 |
| WO | 2005038821 | 4/2005 |
| WO | 2005081940 | 9/2005 |
| WO | 2008094297 | 8/2008 |

OTHER PUBLICATIONS

Guharay,S.K., Douglass,S., Orloff,J."High resolution primary ion beam probe for SIMS", Applied Surface Science, 234-232, pp. 926-929, 2004.*

C.D. Coath, et al., "A High-Brightness Duoplasmatron Ion Source for Microprobe Secondary-Ion Mass Spectrometry," Rev. Sci. Instrum., Feb. 1995, pp. 1018-1023, vol. 66, Iss. 2.

J.R. Coupland, et al., "A Study of the Ion Beam Intensity and Divergence Obtained from a Single Aperture Three Electrode Extraction System," Rev. Sci. Instrum., Sep. 1973, pp. 1258-1270, vol. 44, No. 9.

P.N. Daykin, "Electrode Shapes for a Cylindrical Electron Beam," British Journal of Applied Physics, 1955, p. 248, vol. 6.

E.R. Harrison, "Approximate Electrode Shapes for a Cylindrical Electron Beam," British Journal of Applied Physics, Jan. 1954, pp. 40-41, vol. 5.

J. Hopwood, "A Microfabricated Inductively-Coupled Plasma Generator," Journal of Microelectromachanical Systems, Sep. 2000, pp. 309-313, vol. 9, Issue 3.

X. Jiang et al., "Mini RF-Driven Ion Sources for Focused Ion Bean Systems," Review of Scientific Instruments, Apr. 2003, pp. 2288-2292, vol. 74, No. 4.

W. Johnson, "Electrostatically-Shielded Inductively-Coupled RF Plasma Sources," High Density Plasma Sources, 1995, pp. 100-148, Chapter 3.

M.A. Lieberman, et al., "Principles of Plasma Discharges and Materials Processing," John Wiley & Sons, New York, 1994, 1st Edition, pp. 31-37, p. 157-163.

Ka-Ngo Leung, "Plasma Sources for Electrons and Ion Beams," J. Vac. Sci, Technology B, Nov./Dec. 1999, pp. 2776-2778, vol. 17, No. 6.

Jose V. Mathew, et al., "Subcutoff Microwave Driven Plasma Ion Sources for Multielemental Focused Ion Beam Systems," Review of Scientific Instruments, 2008, 5 pages, vol. 79.

L.K. Ono, et al., "A Compact Gas Cluster Ion Beam Source of QSEC," 2003, 4 pages.

Singletron Acceletor Systems: Coaxial and In-Line Positive Ion Acceletators, 6 pages.

N.S. Smith, et al., "High Brightness Inductively Coupled Plasma Source for High Current Focused Ion Beam Applications," J. Vac. Sci. Technol. B, Nov./Dec. 2006, pp. 2902-2906, vol. 24, Issue 6.

Y. Yin, et al., "Miniaturization of Inductively Coupled Plasma Sources," Plasma Science, Oct. 1999, pp. 1516-1524, vol. 27, Issue 5.

* cited by examiner

CHARGED PARTICLE EXTRACTION DEVICE AND METHOD OF DESIGN THERE FOR

This application is a Continuation of U.S. application Ser. No. 10/588,981, having a 371 filing date of Mar. 27, 2008 now U.S. Pat. No. 7,872,242, which is the 371 filing of and claims priority from PCT Application No. PCT/US2004/034984, filed on Oct. 16, 2004, which claims priority from Australian Application No. 2003905709, filed Oct. 17, 2003, which are hereby incorporated by reference.

TECHNICAL FIELD OF THE INVENTION

The present invention relates to the extraction of a charged particle beam from a plasma. The invention is particularly directed toward the extraction of high brightness beams.

BACKGROUND OF THE INVENTION

There exists a range of applications for ion beams particularly in the semiconductor industry. For example, the fabrication and correction of lithography masks involves sub-micron etching capability. This is currently achieved using medium-energy particle beams (10-50 kilo-electron-Volts (keV)), commonly referred to as Focused Ion Beams (FIB). To enable sub-micron feature creation, the FIB must be capable of focus down to a nanometer scale spot size. This requires the extraction of very high brightness beams in excess of $10^5$ Angstroms per steradian per meter squared (A/sr/m$^2$).

Liquid Metal Ion Source (LMIS) technology has been capable of this level of brightness for many years. The technology exploits the capillary effect of liquid Gallium to cover a sharp Tungsten needle onto which a strong electric field is applied, thereby removing ions. The effect of the field is strongest at the needle point and so a beam of ions is created that appears to diverge from a nanometer spot. The beam is then accelerated and focused onto the target where it sputters the surface by collision processes.

Though LMIS technology may present nanometer scale milling capability, it produces unwanted doping effects by introducing Gallium into a substrate or target. To avoid this, a high brightness beam of inert ions would be preferable. Inert ions could be extracted from an inert ion gas plasma. But this has proved difficult and much research is devoted to improvement of extraction mechanisms to extract the ions from the plasma in the form of a beam. For example, electrode extraction optimization by adjustment of aperture ratios and electrode spacing is described by J. R. Copeland, et. al., "A study of the ion beam intensity and divergence obtained from a single aperture three electrode extraction system", Rev. Sci. Instrum., 44(9):1258, 1973. Other references describing shaping of electrodes include D. E. Radley, "The theory of the pierce type electric gun" J. Electron. Control, 4:125, 1957. E. R. Harrison, "Approximate electrode shapes for a cylindrical electron beam" Brit. J. Appl. Phys., 5:40, 1953, and P. N. Daykin, "Electrode shapes for a cylindrical electron beam" Brit. J. Appl. Phys., 6:248, 1955. Despite these efforts brightness in excess of $10^5$ A/sr/m$^2$ has not been achieved with a plasma ion source. Thus, in the field of extracting an ion beam from a plasma, design of electrodes for extracting a beam of high brightness is desired.

SUMMARY OF THE INVENTION

The present invention provides a method for design of an extraction device to achieve a charged particle beam of high brightness. According to an aspect of the present invention a set of electrodes, each with an aperture, is provided and a beam is drawn from a charged particle source through the apertures of the electrodes. The shapes of the electrodes and the potentials applied to them produce a low-emittance beam.

According to another aspect of the invention, the shapes and potentials applied to the electrodes produce a substantially zero electric field in the vicinity of the aperture of the last electrode furthest from the particle source. The shapes, potentials and positions of the electrodes to achieve zero or low emittance growth are determined from a set of boundary conditions applied at concentric surfaces. The boundary conditions include a substantial, non-zero, electric field in the vicinity of the aperture of the first electrode.

The foregoing has outlined rather broadly aspects, features and technical advantages of the present invention in order that the detailed description of the invention that follows may be better understood. Additional aspects, features and advantages of the invention will be described hereinafter. It should be appreciated by those skilled in the art that the disclosure provided herein may be readily utilized as a basis for modifying or designing other structures for carrying out the same purposes of the present invention. Persons of skill in the art will realize that such equivalent constructions do not depart from the spirit and scope of the invention as set forth in the appended claims, and that not all objects attainable by the present invention need be attained in each and every embodiment that falls within the scope of the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments but, on the contrary, the intention is to cover all modifications, equivalents, and alternatives falling within the spirit and scope of the present invention as defined by the appended claims. The detailed descriptions below make such embodiments obvious to a person of ordinary skill in the art.

The present invention is particularly directed to the extraction of a high brightness ion beam with low aberrations, and is applicable to the formation of low-emittance charged particle beams. Generally, minimizing emittance ensures the highest possible beam brightness. Emittance is a measure of the parallelism of the individual particle trajectories in a beam. For planar symmetry, particles follow rectilinear and parallel trajectories. For cylindrical and spherical symmetry they move along rectilinear paths that follow radial lines as though diverging from or converging to a single line or point.

Thus, the design of low aberration electrodes starts with the accurate description of the beam to be extracted. Assumed throughout this description is that the desired beam density profile is radially uniform (with respect to the beam axis of symmetry). However, the end user of the device must specify the desired beam shape, beam current density and extraction potential.

The beam shapes described herein are categorized by the aspect of the aperture through which they are extracted, being either a rectangular slit or a circular orifice, and by the angle of divergence of the beam envelope. With these categorizations the following beam types are possible:
1) Parallel beam envelope: cylindrical (circular aperture) and strip (rectangular slit) beams
2) Diverging beam envelope: diverging conical beam (circular aperture) and diverging wedge beams (rectangular slits)
3) Converging beam envelope: converging conical beam (circular aperture) and converging wedge beams (rectangular slits)

These beam types can be thought of as angular sections of current flowing between the concentric surfaces of a standard classical diode as described by Child, Langmuir and Blodgett (CLB). There are three diode configurations. The first is two parallel plates. The second is two concentric cylinders and the third is two concentric spheres. All surfaces are assumed to be perfect conductors. In the case of cylindrical and spherical diodes, current flows from the inner surface to the outer surface to yield a diverging current profile. Or, current flows from the outer surface to the inner surface to produce a converging current profile. If the conducting surfaces are parallel, the current can flow in either direction and results in a parallel current profile.

In the basic CLB analysis the emitting surface is assumed to have an undepleteable source of charged particles with no inherent thermal energy and zero electric field. The emitted particles are taken to enter the extraction gap with no initial velocity. Under these circumstances a current is caused to flow when a potential is applied between the two conducting surfaces (also called electrodes). This potential drop is referred to as the extraction potential.

Because of symmetry considerations, the cylindrical and spherical diodes can be analyzed in two dimensions without any loss of generality. A polar reference frame can be defined with its origin, O, at the center of concentricity and the vector r running along any radius emanating from O. The potential distribution along any radius r is identical from symmetry considerations and is determined by both the applied extraction potential and the presence of charged particles flowing as current between the emitting and collecting surfaces. The function that describes this potential distribution (and consequently the density distribution) of the inter-electrode gap along any radius r, subject to the above mentioned assumptions was first described in the parallel case by Child and Langmuir (independently) and in the cylindrical and spherical cases by Langmuir and Blodgett (together).

It was Pierce in the 1940s who first suggested that electrodes could be designed to form a beam that flowed like the particles in a classical diode. Because of symmetry considerations, azimuthal forces in classical diodes can be ignored because adjacent particles apply equal and opposite forces on each other and hence only radial forces exist. Pierce reasoned that an electric field structure could be set-up in the charge free region adjacent to the beam that compensated azimuthal space charge forces in the same way that charged particles do in diodes. He solved this problem for a parallel strip beam. In 1964, Radley solved Laplace's equation (the relation describing the electric field in the charge free region) in general terms, repeating Pierce's finding in a more rigorous fashion and extending the solutions to encompass a broad range of beam types including those mentioned above.

In principle the beams flowing in the Pierce and Radley electrodes are aberration free, but they only describe current flow between two electrodes. The problem addressed here is that the electric field in the beam at the second electrode as described by the CLB potential profiles is very large. Well known from field theory is that the presence of an electric field on one side of an aperture causes the electric field to balloon out to the field free region, resulting in equipotential lines that are strongly curved in the neighborhood of the aperture. This creates a lens effect that disturbs the beam density profiles (and hence the potential profiles). In this case the CLB equations can no longer be used. The electrode structure no longer adequately compensates the space charge forces in the beam. This results in strong emittance growth and a decline in brightness (a key metric of beam quality).

The problem is solved with multiple stages of electrodes. Thus, the analysis uses more than two concentric surfaces so that there exist two extraction stages. The first stage results in a strong electric field. The second stage serves to bring the strong electric field at the end of the first stage back to zero so that no lens effect occurs at the end of either the first or second stage. The beam potential profile in the second stage is obtained by generalizing the CLB equations. The potential profile can be used to determine the ideal electrode shapes for the second stage by substitution into Radley's equations.

Most ion extraction optics consist of at least three electrodes to block the passage of electrons (created by secondary emission) from the transport region aft of the extractor. The first two serve to extract, focus and accelerate the ions and the third to create a potential barrier to the passage of electrons. Typically this is achieved by applying the extraction potential to the first electrode (in contact with the plasma) and extracting the beam initially to some negative potential applied to the second electrode and then returning the beam potential to ground between the second and third electrodes. The net result is that the beam particles have a final energy equal to the extraction potential. But the electrons in the transport region see a potential barrier equal to the potential difference between the second and third electrodes and hence are blocked from entering the extraction region where their presence has nefarious effects on the beam distribution profiles.

In this simple, common triode system, the electric field in the beam is undesirably still very strong at both the ends of the extraction stage (between electrodes 1 and 2) and the blocking stage (between electrodes 2 and 3). Thus, in an embodiment of the present invention, the electric field at the output of the exit aperture of a three electrode system is brought to zero. This embodiment is sufficient to produce a low, ideally zero emittance growth beam in the absence of electrons.

In another embodiment, a five electrode system is employed. In the five electrode system, the electric field in the beam is brought to zero at (in the vicinity of) the apertures of the third electrode and the fifth electrode. Electrodes one, two and three form a two-stage extraction region in which the electric field magnitude rises from its value at the meniscus to a high value at the aperture of the second electrode and then declines to substantially zero at the aperture of the third electrode. Electrodes three, four and five form a two-stage blocking region in which the electric field magnitude rises from substantially zero at the aperture of the third electrode to an intermediate value at the aperture of the fourth electrode and then declines again to zero at the aperture of the fifth electrode. In this embodiment, the blocking stage inhibits the presence of electrons while maintaining the desired beam profile. The result is a 5 electrode extraction system. This is the number of electrodes used to ensure the electric field is brought to zero at the end of both the extraction and blocking stages while taking into account the presence of electrons. If electrons were not present only three electrodes would be required.

In the analysis presented herein, the beam distributions are generalized to take into account the non-zero electric field at the meniscus and the non-zero velocity at the entry to the blocking region. We use Radley's solutions to determine the electrode shapes. Except for the first and last electrodes, both faces of each electrode are shaped. For the first electrode only the face adjacent to the beam needs to be shaped. For the fifth electrode only the front face (relative to the direction of the current flow) needs to be shaped.

A major assumption of the CLB equations is that the electric field at the emitting surface is zero. This is not true in the case of plasmas where the emitting surface is the plasma meniscus (interface between the plasma and the beam) at which there exists a strong electric field typically on the order of the hundreds of kilo-Volts but also in some cases in the Mega-Volts. This must be taken into account in the description of the beam potential profile in the first stage of the extraction region. Thus, the basic CLB equations cannot be applied to beams extracted from plasmas under the assumptions presented above. To apply them to this analytical technique for the design of low emittance electrodes, they must be generalized.

For the second stage of both the extraction and blocking regions the generalization is simpler requiring only a change in boundary conditions to obtain the CLB solutions in reverse. It is this that allows the potential profile to be brought to zero. Note also, that after the first extraction stage, initial velocity must also be taken into account, but this is done with a simple mathematical transformation.

Figure 1:
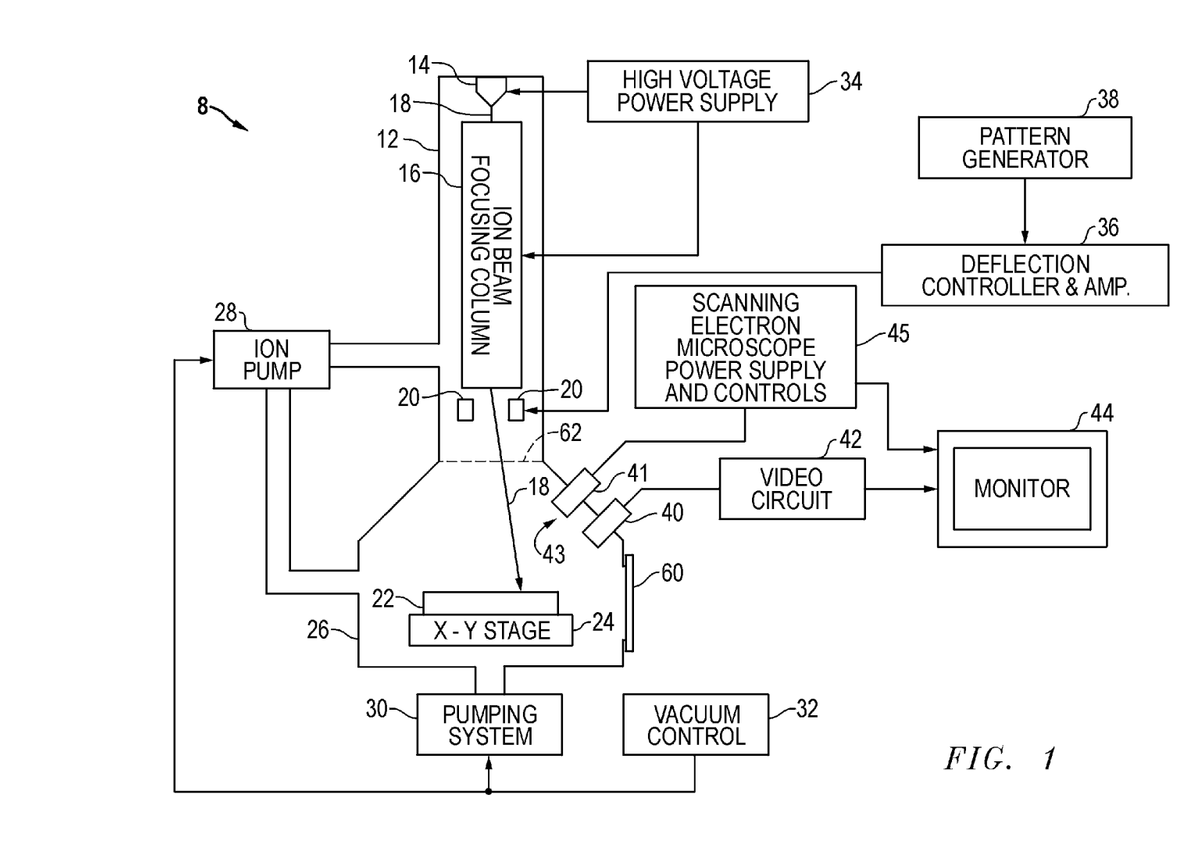
FIG. 1 is a block diagram of an embodiment of the invention.

FIG. 1 shows a focused ion beam system 8 that includes an evacuated envelope 12 in which is located a plasma source and an extraction mechanism 14, to provide a dense plasma for ion beam focusing column 16. An ion beam 18 passes from source 14 through column optics 16 and between electrostatic deflection mechanism 20 toward specimen 22, which comprises, for example, a semiconductor device positioned on movable X-Y stage 24 within lower chamber 26. An ion pump 28, operating in conjunction with pumping system 30 and vacuum control 32, is employed for evacuating the source and maintaining high vacuum in the upper column optics region. The vacuum system provides within chamber 26 a vacuum of typically between approximately 1×10-7 Torr and 5×10-4 Torr, with nominally 10 mTorr in the plasma source and <1×10-6 Torr in the column optics chamber.

High voltage power supply 34 is connected to ion source 14 as well as to appropriate electrodes in focusing column 16 for forming an approximately ion beam 18 and directing the same downward. Deflection controller and amplifier 36, operated in accordance with a prescribed pattern provided by pattern generator 38, is coupled to deflection plates 20 whereby beam 18 may be controlled to trace out a corresponding pattern on the upper surface of specimen 22. In some systems, the deflection plates are placed before the final lens, as is well known in the art.

The ion beam source 14 is brought to a focus at specimen 22 for either modifying the surface 22 by ion milling, material deposition, or for the purpose of imaging the surface 22. A charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are optionally provided with the FIB system 8.

Signals applied to deflection controller and amplifier 36, cause the focused ion beam to move within a target area to be imaged or milled according to a pattern controlled by pattern generator 38. Emissions from each sample point are collected by charged particle multiplier 40 to create an image that is displayed on video monitor 44 by way of video circuit 42. An operator viewing the image may adjust the voltages applied to various optical elements in column 16 to focus the beam and adjust the beam for various aberrations. Focusing optics in column 16 may comprise mechanisms known in the art for focusing or methods to be developed in the future.

Figure 2:
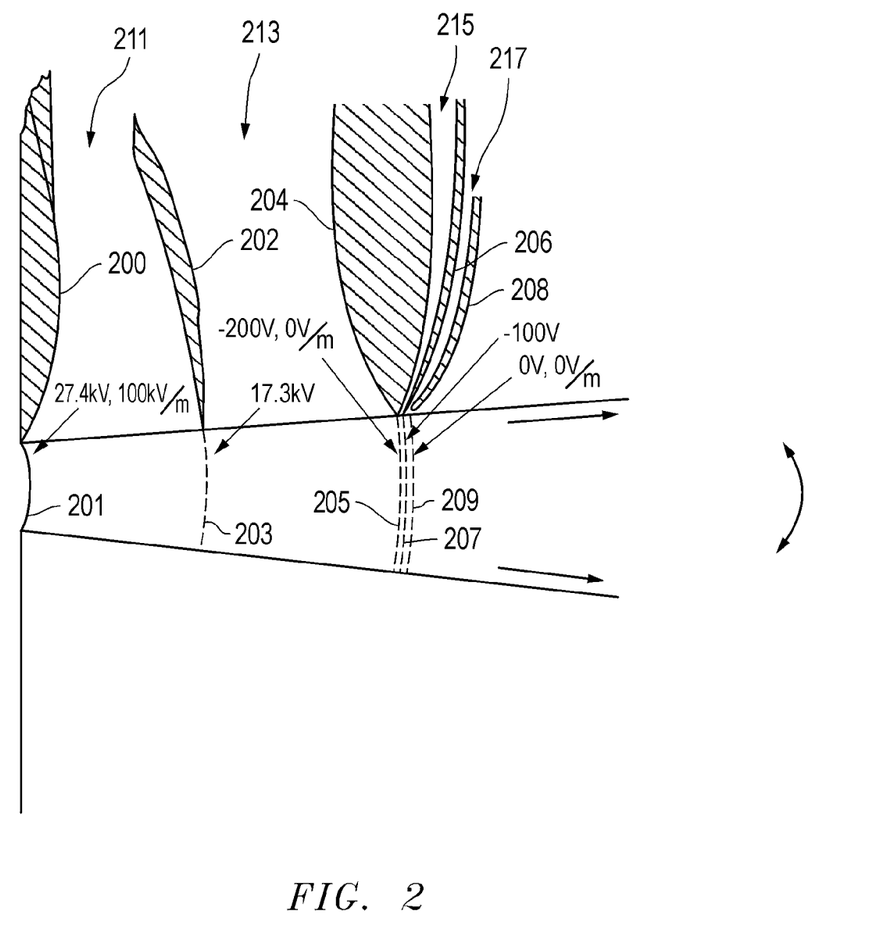
FIG. 2 is an illustration of electrodes in an embodiment of the invention.

An embodiment of an extraction mechanism for extracting an ion beam from the plasma source is illustrated in FIG. 2, which shows a sequence of electrodes, each with an aperture corresponding to a beam profile. Electric potentials are applied to the electrodes to compensate for azimuthal space charge forces and to ensure that the electric field at the output of the sequence of electrodes is brought to zero.

The potentials shown in FIG. 2 are nominal values for a diverging beam from a Krypton plasma density of about $10^{13}$ $cm^{-3}$. The actual potentials and shapes of the electrodes will depend upon the selected beam type, the desired extraction energy, the total beam current and current density, as well as electrode potentials selected by the designer. As will be seen, given the methodology disclosed herein, zero or nearly zero emittance growth can be achieved with a plurality of combinations of voltages and corresponding shapes. Thus, the potentials shown in FIG. 2 are for exposition.

FIG. 2 shows a first electrode 200 closest to the plasma source, referred to herein as the plasma electrode. The plasma electrode exhibits a high electric potential of 27.4 kilo-Volts (kV) with a substantial non-zero electric field on the order of 100 kV/meter in the vicinity of its aperture. A second electrode 202, referred to herein as the acceleration electrode, exhibits a potential of about 17.3 kV. The electric field in the vicinity of the aperture of the second electrode is on the order of 100 MV/m (Mega-Volts per meter).

A third electrode, referred to herein as the first blocking electrode, exhibits a potential of −200V, with a substantially zero electric field in the vicinity of the aperture of the first blocking electrode. A fourth electrode, referred to herein as the second blocking electrode, exhibits a potential of −100V with a substantial, but intermediate, value of electric field in the vicinity of its aperture. A fifth electrode, referred to herein as the ground electrode, exhibits a potential of zero volts and exhibits a substantially zero electric field in the vicinity of its aperture.

Stated in more general terms, the embodiment of FIG. 2 show that V1, the potential on electrode 200 exceeds V2, the potential on electrode 202. V2 exceeds V3, the potential on electrode 204. Also, V5, the potential on electrode 208 exceeds V4, the potential on electrode 206. V4 exceeds V3. V3 and V4 are negative and V5 is zero.

Electrodes 200 and 202 form a first extraction stage 211. Electrodes 202 and 204 form a second extraction stage 213.

Electrodes 204 and 206 form a first blocking stage 215. Electrodes 206 and 208 form a second blocking stage 217. Note that the blocking stage formed by electrodes 204, 206 and 208 impedes the flow of electrons into the extractor region. In the absence of electrons, the electrodes 206 and 208 would not be necessary.

The potentials applied to the electrodes cause a beam flow that produces a substantially zero electric field in the vicinity of the aperture of the ground electrode 208 and in the vicinity of the aperture of the first blocking electrode 204. Bringing the electric field to zero at the end of the extraction stage and at the end of the blocking stage is desired to stop the beam trajectories from being perturbed in the vicinities of these apertures.

The potentials of the electrodes cause a beam flow that produces a high potential gradient in the vicinity of the aperture of the acceleration electrode; a low, preferably zero, potential gradient in the vicinity of the first blocking electrode; an intermediate potential gradient in the vicinity of the aperture of the second blocking electrode; and a low, preferably zero, potential gradient in the vicinity of the aperture of the ground electrode.

Figure 4:
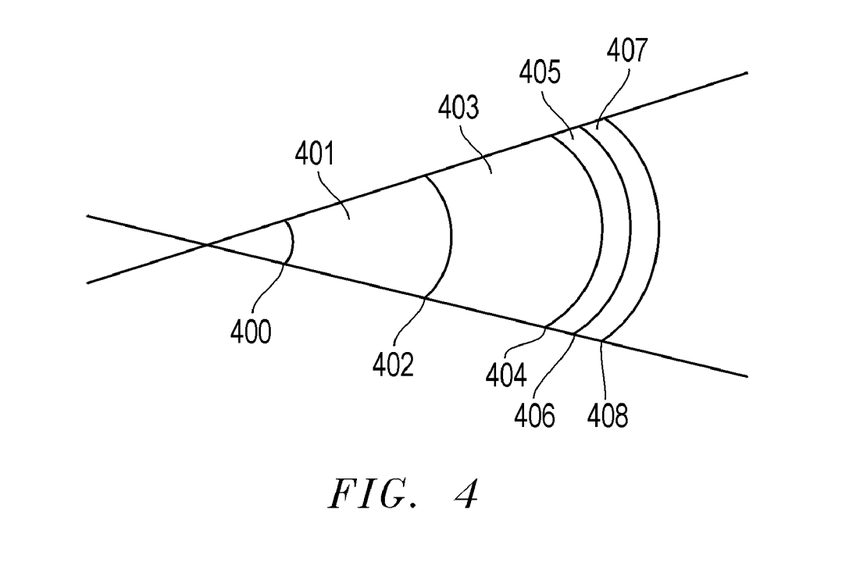
FIG. 4 shows concentric surfaces to which boundary conditions are applied according to the method of the present invention.

The shapes and potentials applied to the electrodes are determined from a set of boundary conditions applied at concentric equipotential surfaces 201, 203, 205, 207, and 209. Each concentric surface is at a radius corresponding to a position of an electrode. That is, the positions of the electrodes are at the positions of the concentric surfaces, and the position of the concentric surfaces are determined from the boundary conditions. Initially, the designer specifies beam type, and the extraction energy, and hence the voltage of the plasma electrode 200. The designer also specifies the beam current density. This defines the required plasma density, and hence, the electric field at the meniscus. The boundary conditions, as described herein, are applied to each concentric surface to produce a low or zero emittance growth beam.

In preferred forms of the invention the beam profile is one of a strip beam, a wedge beam, a cylindrical beam, and a conical beam. These beams can be thought of as sections of current flowing in complete diodes. Consequently, parallel beams can be treated in the same way as a planar diode. Divergent/convergent beams extracted through a rectangular slit can be treated as a cylindrical diode. Divergent/convergent beams extracted through a circular aperture can be treated as a spherical diode. In each case, the plasma/beam interface or plasma meniscus is the anode (emitter) and the 0 Volt equipotential surface is the cathode (collector). The purpose of the extraction device is to ensure that the meniscus and 0 Volt equipotential surfaces are parallel in the case of parallel beams and concentric cylinders or spheres in the case of diverging or converging beams. If this situation is maintained then, neglecting the inherent ion temperature in the plasma, the ions travel in perfect parallelism along radial lines from the meniscus to the 0 Volt equipotential surface and suffer no deflection. In other words the beams have zero emittance growth.

By accelerating the beam, a significant electric field can be produced in the direction of flow. In accordance with the present invention this is compensated to avoid the electric field in the beam from ballooning outwards at the exit of the extractor and deflecting the ion trajectories. In the transport region aft of the extractor, considerable advantage can be gained by the presence of electrons which neutralize the beam space charge. However, their presence in the extractor, especially in the acceleration gap, is highly detrimental to beam quality since they alter the charge density distribution and hence the potential structure through-out the extractor. The existence of an electric field at the exit to the extractor would serve to accelerate electrons into the extraction region in such quantity as to neutralize the electric field at the extractor exit. Accordingly the present invention ensures that the beam potential has zero electric field upon exit of the extractor.

The electrons in the beam plasma aft of the extractor have non-zero temperature and are generally distributed according to Maxwell's law. This means that higher energy electrons from the tail of the distribution are able to enter the extractor if a blocking field is not present. To this end a small blocking potential preferably of some hundred Volts is produced at the end of the extraction region to inhibit the passage of electrons. Again, to avoid ballooning of the electric field this potential must be produced so that the electric field upon exit of the blocking region is zero.

Figure 3:
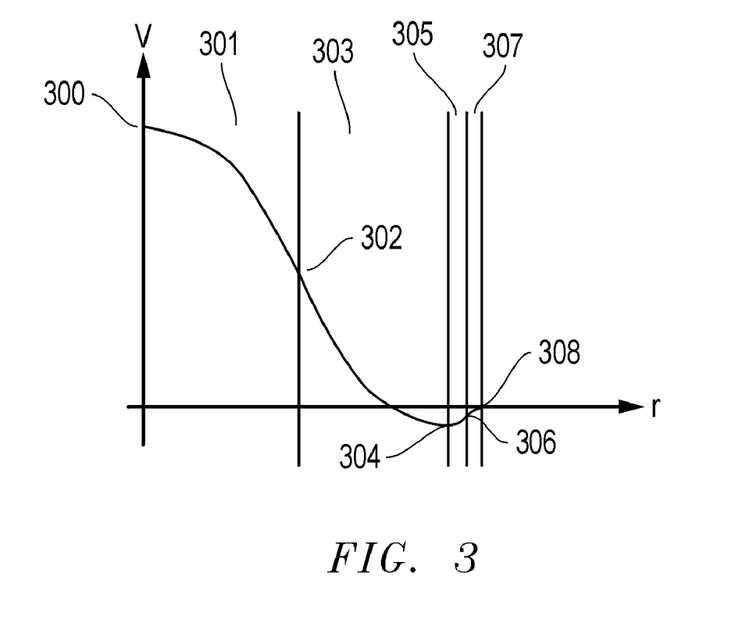
FIG. 3 shows a potential distribution for an embodiment of the invention

In a preferred form of the invention the potential distribution in the beam will then have the form shown in FIG. 3. There are two regions called the Extraction and Blocking regions both of which are divided into two stages. Stage 1, 301, of the extraction region takes the beam from a low gradient to a high gradient and stage 2, 303 takes the beam from the high gradient to a low gradient. In the extraction region, stage 1 is necessary to match the beam potential to the plasma sheath and stage 2 is necessary to bring the electric field to zero. A similar rationale applies to the two stages of the blocking region.

The extractor region is formed by the first three sequential electrodes. Stage 1 and stage 2 of the extractor region are separated by the acceleration electrode. The blocking region is formed between the first blocking electrode and the last electrode. Stage 1, 305, and stage 2, 307, of the blocking region are separated by the second blocking electrode. In an embodiment of the present invention the last electrode is a "ground" electrode with a zero electric field and zero potential in the beam in the vicinity of the aperture of the last electrode.

In order to describe the plasma extractor device of the present invention it is desirable to first provide some analysis of beam distributions and an overview of solutions to Laplace's equation for different beam profiles. This will be done in separately headed sections which precede an explanation of electrode design and specific examples of the invention.

FIG. 3 shows the general shape of the potential along the beam inside the extractor region and blocking region for low, ideally zero, emittance growth extraction. The overall potential profile is in fact four distributions concatenated. Each stage. 301, 303, 305, and 307, is bounded by two plane or two concentric surfaces depending on the beam type, so that each stage can be treated as separate, 'complete' diodes, each with its own set of boundary conditions. To get the complete distribution, the solutions are stitched together by matching the boundary conditions at each surface.

Thus, referring to FIG. 4, the first extraction stage 401 is bounded by surface 401 and surface 402. The second extraction stage 403 is bounded by surface 402 and surface 404. The first blocking stage 405 is bounded by surfaces 404 and 406. The second blocking stage 407 is bounded by surfaces 406 and 408. The positions of each surface correspond to the positions of the respective electrodes.

Referring again to FIG. 3, at point 300, which corresponds to the surface in the proximity of the aperture of the first electrode 200, the electric potential is a high value. Also, the potential gradient (electric field), which is the slope of the potential curve, at point 300 is a substantial non-zero value. The present invention takes into account this non-zero electric field. At point 302, which corresponds to the surface in the proximity of the aperture of acceleration electrode 202, the slope (potential gradient) is a large value. Thus, the electric field magnitude is high in the vicinity of the aperture of the acceleration electrode.

At point 304, which corresponds to the surface in the proximity of the aperture of first blocking electrode 204, the electric potential is a relatively small, but non-zero, negative value, and the electric field magnitude is substantially zero. At point 306, which corresponds to the surface in the proximity of the aperture of the second blocking electrode 206, the electric potential is an intermediate, non-zero, value. The electric field magnitude there is a non-zero intermediate value. At point 308, which corresponds to the surface in the proximity of the aperture of the last electrode 208, the potential and potential gradient are both zero.

The potential and charge distributions in the beam at each stage of extraction are governed by Poisson's law. The basic solution to this problem, using simple boundary conditions, in plane symmetry was solved by Child and Langmuir in 1911 and 1914 respectively, and in cylindrical and spherical symmetry by Langmuir and Blodgett in the 1920s. These initial solutions assumed only one charged particle species (notably electrons), and ignored initial velocity.

Applicants introduce several generalizations. In particular, we consider distributions describing non-zero initial gradient, distributions describing non-negligible initial velocity, distributions tapering from a strong gradient to a zero gradient (the reverse of the standard Langmuir-Blodgett solution) and distributions describing the presence of Maxwellian electrons. A further requirement on these distributions is that they have the same form as the standard Langmuir-Blodgett series solutions since the Radley solutions to Laplace's equation are dependent on this form.

The work published by Langmuir-Blodgett in the 1920s forms the basis for the beam distribution analysis that follows and is given in terms of simple and compact series solutions. A cursory mathematical overview of Langmuir-Blodgett's contribution starting with spherical symmetry and working through cylindrical to planar symmetry is provided. In the case of ion beam extraction from a circular aperture the charge and potential distributions in the beam are assumed to be analogous to those in a complete spherical diode.

Following Langmuir and Blodgett, Poisson's equation between two concentric spheres can be stated as $$\frac{1}{r^2}\frac{d}{dr}\left(r^2\frac{dV}{dr}\right) = \frac{\rho}{\varepsilon_o} \quad (1)$$

where V is the potential at a point a distance r from the common center and ρ is the ion charge density. The current flowing in the diode can be written in terms of the particle velocity, v:

$$I = 4\pi r^2 \rho v \quad (2)$$

where the velocity can be written in terms of the voltage V using the kinetic energy relation:

$$\frac{1}{2}Mv^2 = -eV \quad (3)$$

Combining equations (1), (2) and (3) yields:

$$r^2\frac{d^2V}{dr^2} + 2r\frac{dV}{dr} = A(-V)^{1/2} \quad (4)$$

where:

$$A = \frac{I}{4\pi\varepsilon_o}\sqrt{\frac{M}{2e}} \quad (5)$$

Equation (4) can probably not be integrated directly but a series solution can be found. The form of the solution is a function of the ratio $R = r/r_s$ $$V(R) = \left(\frac{9}{4}A\right)^{\frac{2}{3}} f^{\frac{4}{3}}(R) \quad (6)$$

where f is the analytic function to be found. The term $$\left(\frac{9}{4}A\right)^{\frac{2}{3}}$$

serves to normalize for the constant term A, which is related to the current and hence the plasma density and meniscus curvature. The term $$f^{\frac{4}{3}}(R)$$

serves to remove the square root and hence to simplify subsequent derivations.

A further transformation is performed by setting:

$$\gamma = \ln(R) \quad (7)$$

so that a solution to equation 6 can be expressed in terms of a MacLauren series as follows:

$$f = \sum_{n=0}^{\infty} a_n \gamma^n \quad (8)$$

Now substituting equation (6) into equation (4) and using equation (7) results in:

$$3ff'' + f'^2 + 3ff' = 1 \quad (9)$$

where the prime denotes the derivative with respect to γ and the double-prime indicates the second derivative with respect to γ. From the form of equation (9) it can be seen that where f=0, we have f'=1. Then, the first six terms of the series solution are:

$$f = \gamma - 0.3\gamma^2 + 0.075\gamma^3 - 0.0143182\gamma^4 + 0.0021609\gamma^5 - 0.00026791\gamma^6 \quad (10)$$

corresponding to V=0 and V'=0.

A similar derivation is made for the case of cylindrical symmetry. Poisson's equation becomes:

$$r\frac{d^2V}{dr^2} + \frac{dV}{dr} = B(-V)^{1/2} \tag{11}$$

where:

$$B = \frac{I}{2\pi l \sqrt{\frac{m}{2e}}} \tag{12}$$

and l is the length of the extraction slit. The solution takes the form:

$$V(R) = \left(\frac{9}{2}Br\right)^{\frac{2}{3}} g^{\frac{4}{3}} \tag{13}$$

where g is the analytic function to be found over the desired range of r. Substituting equation (13) into equation (11) and using equation (7) results in:

$$3gg'' + g'^2 + 4gg' + g^2 = 1 \tag{14}$$

For g=0, g=1 and the series solution is:

$$g = \gamma - 0.4\gamma^2 + 0.0916667\gamma^3 - 0.01424242\gamma^4 + 0.001679275\gamma^5 - 0.0001612219\gamma^6 \tag{15}$$

corresponding to V=0 and V'=0.

Non-Zero Initial Gradient

Figure 5:
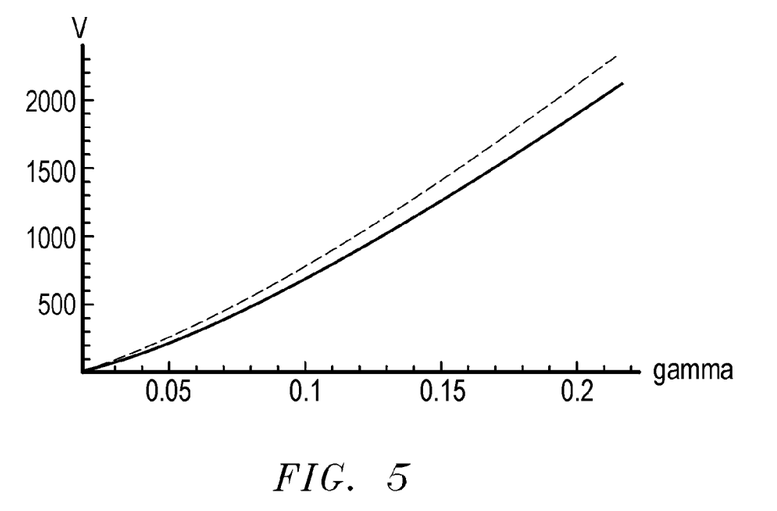
FIG. 5 is a graph showing the effects of non-zero initial gradient

The assumption that the electric field at the meniscus surface is zero, central to the Child-Langmuir and Langmuir-Blodgett derivations, is incorrect and so will be herein generalized. Furthermore, the final result will be presented in an easy to use series formulation similar to the original Langmuir-Blodgett relation. FIG. 5 demonstrates the effect of non-zero initial gradient. The dashed line corresponds to the case of a divergent conical beam extracted from a plasma of density n=10$^{14}$ cm$^{-3}$ and is compared to the standard Langmuir-Blodgett distribution which assumes zero initial gradient.

To understand why the gradient at the plasma/sheath interface and meniscus is non-zero it is necessary to consider the Bohm sheath criterion which stipulates the minimum ion velocity for entry into the sheath to maintain a stable sheath at a plasma boundary. In conjunction with some distribution relation for electrons, this defines a potential structure within the sheath. In particular, the electric field at the plasma boundary is non-zero and is typically several hundred kilo-volts per meter. For continuity of the electric field across the plasma/beam interface the potential gradient must be equal on both sides of this surface, This is not assured by the original assumptions of Langmuir and Blodgett who were modeling particle flow from thermionic cathodes. In that case the source of particles was assumed to be undeletable and to have no intrinsic electric field so that for equilibrium the boundary condition in the extractor was for the electric field to be zero at the entry to the acceleration gap. In the case of plasmas, the flux of ions is fixed and an intrinsic electric field does exist in the sheath which separates the beam from the bulk plasma. This strongly implies that particle beam extraction from plasmas is not space charge limited but rather is source limited and further implies that the voltage distribution in the beam is not given by the Langmuir-Blodgett relation as is usually stated.

General solutions to Poisson's equation for the case of non-zero initial gradient are first present followed by a discussion of the plasma sheath and how the gradient at the meniscus is obtained.

Spherical Symmetry

Taking the first derivative of equation (6), yields:

$$V'(\gamma) = \lambda\sqrt{p} \tag{16}$$

where $\lambda = \frac{4}{3}\left(\frac{9}{4}A\right)^{\frac{2}{3}}$ and $p = f'(\gamma)^2 f(\gamma)^{\frac{2}{3}}$, for γ=0. In the classic Langmuir-Blodgett derivation, f(γ), 0 in (9) leads to f'(γ)=0, for γ=1, (assuming potential increases as a function of position in the extractor,) so that p=0 and hence V' (γ=0)=0. In other words, the Langmuir-Blodgett derivation requires a zero initial gradient in potential. Numerically, however, it is possible to have f approach zero without requiring V'(0) to be zero by setting f'(0) such that (16) holds for the desired value of V'(0). For a given value of V(0) and A, there is a limit to how small f(0) can be set, but in most practical cases it is several orders of magnitude less than unity.

The solution depends only on p, rather than the individual values of f(0) and f'(0), for the range of p which is of interest. Let the series coefficients, $a_n$, be expressed as a quadratic:

$$a_n = \alpha_n + \beta_n + \gamma_n \tag{17}$$

where the α, β, and γ are the expansion coefficients found by a least squares method. These terms are presented in the following table.

TABLE 1

Expansion terms for the coefficients of the MacLauren series (see equation 17) for the spherical case.

| n | $\alpha_n$ | $\beta_n$ | $\gamma_n$ |
|---|---|---|---|
| 1 | 1.0035 | 4.049 | −10.92 |
| 2 | −0.3084 | −8.008 | 25.11 |
| 3 | 0.08338 | 7.791 | −25.85 |
| 4 | −0.01825 | −3.96 | 13.47 |
| 5 | 0.002870 | 1.0004 | −3.448 |
| 6 | −0.0002227 | −0.09904 | 0.3441 |

Note that the $\alpha_n$ are very close to the original Langmuir-Blodgett series coefficients.

Cylindrical Symmetry

Taking the first derivative of the potential and writing it in terms of the parameter p, we have:

$$V'(R) = \mu\left(g^{\frac{4}{3}} + 2\sqrt{p}\right) \text{ where } \mu = \frac{2}{3}\left(\frac{9}{2}Be^\gamma\right)^{\frac{2}{3}} \tag{18}$$

and with R=1. Note that in the limit as g approaches zero the term in g disappears, so that V'(R)≈2μ√p. This has the same form as the spherical case discussed above. We write:

$$g = \sum_{n=0}^{\infty} b_n \gamma^n \tag{19}$$

and plotting the series coefficients in terms of the parameter p yields:

$$b_n = \alpha_n + \beta_n + \gamma_n \tag{20}$$

where the α, β, and γ are the expansion coefficients found in the same way as for the spherical case. These terms are presented in the following table.

TABLE 2

Expansion terms for the coefficients of the MacLauren series (see equation 20) for the cylindrical case.

| n | $\alpha_n$ | $\beta_n$ | $\gamma_n$ |
|---|---|---|---|
| 1 | 1.0034 | 3.989 | −10.69 |
| 2 | −0.4086 | −8.223 | 25.43 |
| 3 | 0.1005 | 7.974 | −26.22 |
| 4 | −0.01866 | −4.038 | 13.65 |
| 5 | 0.002658 | 1.0184 | −3.491 |
| 6 | −0.0002011 | −0.1007 | 0.3482 |

Note again that the $\alpha_n$ are very close to the original Langmuir-Blodgett series coefficients.

The Plasma Sheath

There are several ways to model the sheath. A method in terms of the Bohm sheath criterion and the Boltzman equation in one dimension, which is easily extended to spherical and cylindrical symmetry is described in full in M. A. Lieberman and A. J. Lichtenberg, "Principles of Plasma Discharges and Materials Processing" John Wiley & Sons, New York, 1$^{st}$ edition, 1994. This model incorporates both the non-zero ion velocity $v_B$ at the entry to the sheath, required by the Bohm criterion, and also the presence of electrons. Another popular method is the Child sheath, which is extended to spherical and cylindrical symmetry by the use of the standard Langmuir-Blodgett corrections. In this case, the pre-sheath/sheath boundary and the meniscus are considered to be concentric spheres for extraction from a circular aperture and concentric cylinders for extraction from a slit. Though solving the Boltzman sheath is possible in terms of a series, it requires a somewhat more drawn out analysis and so for simplicity, the Child sheath method will be employed with Langmuir-Blodgett corrections. As such, the pre-sheath can be ignored and we assume that the velocity of ions and the potential at the bulk plasma/sheath edge are zero. However, it should be noted that the Child sheath yields smaller gradients than the Boltzmann sheath.

Sheath Potential at the Meniscus

To solve equation (4), the case of extraction from a plasma requires that I must equal the ambipolar flux for ions $$\Gamma = 0.6 e n_e v_B A \qquad (21)$$

where $n_e$ is the plasma density at the sheath edge and $A = 4\pi r_s^2$ is the area over which current is extracted, with $r_s$ being the radius of curvature of the sheath. It follows from equation (5) and equation (21) that the solution to equation (4) is strongly related to both $n_e$ and $r_s$.

In addition, three boundary conditions are imposed. At the entry to the sheath set $$V(1) = 0 \text{ and } \frac{dV(1)}{dR} = 0.$$

To determine the sheath potential at the meniscus, equate ion flux, assumed constant throughout the sheath, $$\Gamma_i = \frac{n_e v_B}{R^2} \qquad (22)$$

to the electron flux at the meniscus $$\Gamma_e = \frac{n_s(\overline{v}_e) e^{\frac{eV_m}{kT_e}}}{4R^2} \text{ where } \overline{v}_e = \left(\frac{8eT_e}{\pi m}\right)^{\frac{1}{2}} \qquad (23)$$

is the mean electron velocity and $V_m$ is the potential of the meniscus with respect to the plasma/sheath edge. Thus, upon substitution of the Bohm velocity:

$$n_s\left(\frac{eT_e}{M}\right)^{\frac{1}{2}} = \frac{1}{4} n_s \left(\frac{8eT_e}{\pi m}\right)^{\frac{1}{2}} e^{\frac{eV_m}{kT_e}} \qquad (24)$$

which becomes $$V_m = -T_e \ln\left(\frac{M}{2\pi m}\right)^{\frac{1}{2}} \qquad (25)$$

This can be expressed in a more convenient form by substituting the mass of the extracted ion species. Krypton is a typical gas used in ion beam extraction from plasmas and has a mass of M=84 au. Therefore, in this case, equation (25) can be rewritten as $V_m = -5.05\, T_e$, which, assuming $T_e = 3$ eV, is approximately −15V. This now leads to suitable boundary conditions for equation (4):

$$\begin{cases} V = 0V, r = r_s \\ V = -15, r = r_m \\ \frac{dV}{dR} = 0, r = r_s \end{cases} \qquad (26)$$

where $r_m$ is the radius of curvature of the meniscus.

Potential Gradient at the Meniscus

Since both the voltage and its first derivatives are zero at $r_s$, f is independent of the parameter p. From the familiar Langmuir-Blodgett relation:

$$\alpha(\gamma) = \gamma - 0.3\gamma^2 + 0.075\gamma^3 - 0.0143182\gamma^4 + 0.0021609\gamma^5 - 0.00026791\gamma^6 \qquad (27)$$

This series expansion in conjunction with (6) and the boundary conditions now determine both the sheath width and the potential gradient at the meniscus edge. The sheath width is taken as the value of $r_m - r_s$ for which (6) is equal to (25). The potential gradient at the meniscus edge is then equal to the first derivative of (6) taken at this value of $r_m$.

Assuming a constant electron temperature and gas type, equations (6), (7) and (27) show that the potential gradient at the meniscus edge is dependent on the bulk plasma density and the radius of curvature of the meniscus.

Solving Poisson's Law Backwards

Consider the standard Langmuir-Blodgett problem in reverse, solving the differential equations from the exit of the extractor where the gradient is zero to the entry where it is large. This is tantamount to reversing the distribution in the case of a parallel beam or solving for the opposite convergence in the case of divergent or convergent beams. The f and g series as defined by equation (10) and equation (19) remain unchanged. However the definition of R and hence γ is altered. In the case of a diverging beam, R is taken to be the ratio of the current position to the first concentric surface and thus greater than unity. But in the case where Poisson's equation is solved backwards it is redefined to be the ratio of the current position to the second concentric surface and is hence less than one. The inverse is true for a convergent beam.

Presence of Electrons

To account for the presence of a population of electrons arriving from the tail of a Maxwellian distribution an exponential term is added to the original differential equations to account for the Boltzman relation.

Generalizing for the presence of electrons involves only the Right-Hand-Side (RHS) of Poisson's law:

$$\frac{\rho}{\varepsilon_o} = \frac{e(n_i - n_e)}{\varepsilon_o} \tag{28}$$

Since the electrons belong to a Maxwellian distribution their density as a function of potential is given by Boltzman's law:

$$n_e = n_o \exp\left(\frac{eV}{kT_e}\right) \tag{29}$$

where $n_o$ is some percentage $\zeta$ of the ion density in the beam aft of the extractor to take into account the fact that neutralization is not always 100%. The differential equations for spherical, cylindrical and planar symmetry then become:

$$r^2 V'' + 2rV' = 0.6ne\left[\frac{\tilde{A}}{\sqrt{V}} + \zeta \exp(C)\right], \tag{30}$$

where $\tilde{A} = v_B A \sqrt{\frac{M}{2e}}$ $$rV'' + V' = 0.6ne\left[\frac{\tilde{B}}{\sqrt{V}} + \zeta \exp(C)\right],$$

where $\tilde{B} = v_B \sqrt{\frac{M}{2e}}$ where n is the ion density in the beam, A is the area of the anode, and $$C = \frac{eV}{kT_e}.$$

Here the solutions take a very different form to those presented previously because of the exponential term. However, it is still possible to give a solution of the potential in terms of a MacLauren series, which when suitably normalized yields the correct form for implementation in the solutions to Laplace's equation.

Non-Zero Initial Velocity

The problem is set out in the same fashion as in section 2.1 for negligible initial velocity, except that now the kinetic energy relation is written:

$$\frac{1}{2}Mv^2 - \frac{1}{2}Mv_o^2 = eV \tag{31}$$

When rearranged this yields:

$$v = \sqrt{\frac{2e}{M}V + v_o^2} \tag{32}$$

But since:

$$v_o^2 = \sqrt{\frac{2e}{M}V_{exi}} \tag{33}$$

where $V_{exi}$ is the energy of the particles at the exit of the previous stage, the differential equations stipulated by Poisson's law become for spherical, cylindrical and planar symmetries:

$$r^2 V'' + 2rV' = \frac{A}{\sqrt{V + V_{exi}}} \tag{34}$$

$$rV'' + V' = \frac{B}{\sqrt{V + V_{exi}}}$$

And the solutions to these equations become:

$$V = \left(\frac{9}{4}A\right)^{\frac{2}{3}} f^{\frac{4}{3}} - V_{exi} \tag{35}$$

$$V = \left(\frac{9}{2}B\right)^{\frac{2}{3}} g^{\frac{4}{3}} - V_{exi}$$

Importantly, upon substituting equation (35) into equation (34), equations (9) and (14) remain the same. This means that the initial velocity serves only to translate the solution vertically. The f and g series can still be obtained by the various means set forth above.

Laplace's Equation

In a given region of the extractor according to this invention, determining the electrode geometry amounts to solving Laplace's equation subject to the potential along the beam edge. Since in the three cases of interest—plane, cylindrical and spherical geometry—there is strong symmetry, compact solutions can be obtained. These were presented by Radley in 1957 along with a complete and rigorous mathematical derivation. A cursory overview is provided in the following.

However, before doing so it is noted that in treating the instability issues of the solution, Radley remarks that in as much as small variations of the initial surface can produce large differences in the solution so, conversely, do relatively large variations in electrode shapes away from the beam surface produce only small variations in the form of the beam surface. This will have important implications in the section Electrode Design because electrodes will have to be curtailed to avoid overlap or break-down proximity, Strip Beam A strip beam can be thought of as an infinite plane diode in which the cathode is the plane x=0 and all charge in the region y>0 has been suppressed. To determine electrodes that would extract a beam of this sort a family of equipotentials in y>0 must be found such that the conditions in y<0 are unchanged. The basic case of the potential distribution in space-charge limited flow when suitably normalised yields:

$$V = x^{\frac{4}{3}} \text{ in the region } y \le 0 \tag{36}$$

Since assuming zero ion temperature, the trajectories are rectilinear and, perpendicular to the emission surface defined by the extraction slit, the transverse forces on the beam at the beam edge are zero, so that $$\frac{\partial V}{\partial y} = 0$$

there. Restating the conditions in polar coordinates, gives:

$$\left. \begin{array}{c} V = r^{\frac{4}{3}} \\ \frac{\partial V}{\partial \theta} = 0 \end{array} \right\} \text{ on } \theta = 0. \tag{37}$$

The solution in Cartesian coordinates is:

$$V(x, y) = \text{Re}\{z^{\frac{4}{3}}\} \tag{38}$$

where $$z = x + iy = re^{i\theta} \tag{39}$$

so that the solution is given by the conformal mapping:

$$= V + iU = z^{\frac{4}{3}} \tag{40}$$

Wedge Beam

For a wedge beam it is assumed that the meniscus and 0V equipotential surfaces are concentric cylinders. The coordinate system is therefore chosen so that the origin is at the vertex of the wedge, and the beam surface lies on $\theta=0$. Since the trajectories are rectilinear, lying along the lines $\theta$=constant, $\delta V/\delta\theta$=0 on $\theta$=0. The meniscus is taken to be $r=r_m$ and the cathode to lie somewhere in the region $r>r_n$ in the case of divergent beams and $r<r_m$ in the case of convergent beams. In the following it is assumed that the ratio $R=r/r_m$ is greater than unity or that the wedge is divergent. The potential distribution along the beam edge, 5 when suitably normalized, is given by:

$$V = R^{\frac{2}{3}} \beta^{\frac{4}{3}} \tag{41}$$

where $\beta$ is an infinite power series in the variable $\gamma=\ln(R)$. Equation (41) can be written in series form:

$$V = R^{\frac{2}{3}} \left[ \sum_{n=1}^{\infty} a_n \gamma^n \right]^{\frac{4}{3}} \tag{42}$$

Since $a_n=1$, this last expression may be expanded by the multinomial theorem to give:

$$V = R^{\frac{2}{3}} \gamma^{\frac{4}{3}} \sum_{n=1}^{\infty} b_n \gamma^{n-1} \tag{43}$$

The coefficients, $b_n$, will be presented and discussed below. The potential outside the beam is obtained by writing $Re^{i\theta}$ for R in equation (41). Thus, $\gamma$ is replaced by $\omega=\gamma+i\theta$, so that:

$$V = \text{Re}\left\{ R^{\frac{2}{3}} e^{\frac{2}{3}i\theta} \omega^{\frac{4}{3}} \sum_{n=1}^{\infty} b_n \omega^{n-1} \right\} \tag{44}$$

Cylindrical Beam

For this case cylindrical polar coordinates, $(r,\theta,z)$, are enlarged with the axis of the beam along $r=0$. By suitably normalizing the coordinates, the beam surface can be taken as $r=1$. Since the system has axial symmetry, none of the variables involves $\theta$, so this coordinate may be neglected. The ion flow considered is a cylindrical section of an infinite plane diode so that:

$$\left. \begin{array}{c} V = z^{\frac{4}{3}} \\ \frac{\partial V}{\partial r} = 0 \end{array} \right\} \text{ on } r = 1 \tag{45}$$

Figure 6:
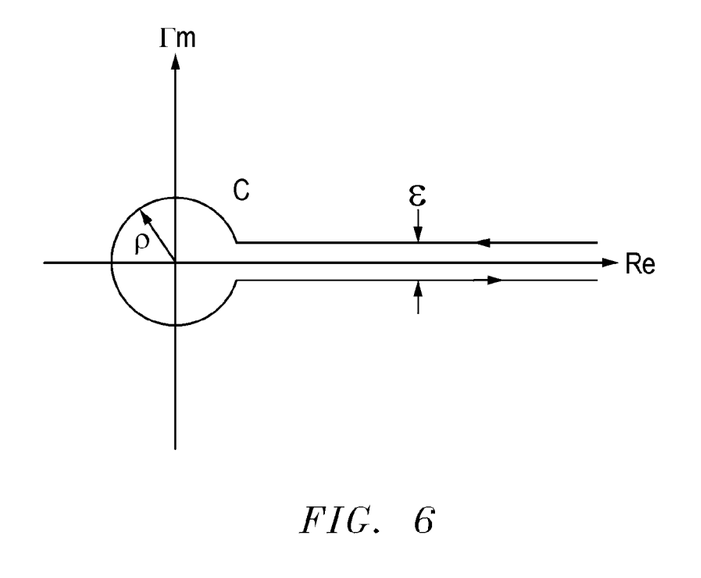
FIG. 6 is a contour of integration of a complex integral.

Applying the analysis in Radley, the solution is:

$$V(r, z) = \frac{1}{2}\pi \frac{1}{\left(-\frac{7}{3}\right)\left(\exp\left(-\frac{14i\pi}{3}\right) - 1\right)} \int_C \frac{\exp(-pz)}{p^{\frac{4}{3}}} (J_1(p)Y_o(pr) - Y_1(p)J_o(pr)) dp \tag{46}$$

where p is a complex parameter, J and Y are Bessel functions of the first and second kind, and C is the contour defined as shown in FIG. 6.

In reality, the contribution of both straight line segments in C cancel and the contour reduces to a circle of radius p. In theory any value of $\rho$ will work but it has been found that values of between 1 and 5 produced the most rapid and accurate results.

Conical Beam

Spherical polar coordinates $(\_r,\theta,\phi)$, are employed with a cone semi-angle of $\theta=\theta_o$, the anode on the sphere $R=1$ and the cathode in the region $R>1$ in the case of a diverging beam and $R<1$ in the case of a converging beam. Again, a diverging beam is assumed for this derivation. Writing $\gamma=\ln(R)$ and suitably normalizing the potential gives:

$$V = f^{\frac{4}{3}} \tag{47}$$

where $$f = \sum_{n=1}^{\infty} c_n \gamma^n \tag{48}$$

The coefficients $c_n$ depend on the boundary conditions for the beam and are discussed herein. Again, this series representation is expanded using the multinomial theorem and becomes:

$$V = \gamma^{\frac{4}{3}} \sum_{n=1}^{\infty} d_n \gamma^{n-1} \quad (49)$$

The boundary conditions to be applied are:

$$\left. \begin{array}{l} V = f^{\frac{4}{3}} \\ \dfrac{\partial V}{\partial r} = 0 \end{array} \right\} \text{ on } \theta = \theta_o$$

and, following Radley, gives:

$$V(r, \theta) = \quad (51)$$
$$\frac{1}{2}\pi \frac{d_n \sin(\theta_o)}{\left(-n - \frac{4}{3}\right)\left(\exp\left(-\frac{14i\pi}{3}\right) - 1\right)} \int_C \frac{\exp(-\upsilon z)}{\upsilon^{n+\frac{4}{3}}} (P_\upsilon(\mu) Q'_\upsilon(\mu) P'_\upsilon(\mu_o)) \, d\upsilon$$

where $\upsilon$ is a complex variable, P and Q are Legendre functions of the first and second kind and C is the contour defined in FIG. 6. Again, the straight line segments cancel so that the contour reduces to a circle. However, now, the radius $\rho$ is dependent on R.

The first step in the design of electrodes is the choice of beam type, beam current and final extraction energy. For each choice there is a different electrode design. It must be determined from the first instance whether the beam is to be strip/wedge or cylindrical/conical and whether it is to be parallel, convergent or divergent. It must be kept in mind that the whole extractor is to act as if the beam was part of an entire diode from the plasma to the 0V equipotential. The electrode design is such that the extractor apertures follow the beam shape so that they are just in contact with the beam at their respective positions.

The Extraction Gaps

Stage 1

The extraction gap stage 1 comprises the aft face of the plasma electrode and front face of the acceleration electrode. Determining the beam distribution in this region, first takes into account that the electric field at the plasma/beam boundary is non-zero due to the plasma sheath. Then, given the beam form required, the relevant solution can be arrived at by following the derivations above. This in turn is substituted into the relevant solution of Laplace's equation. Note that in this region the potential distribution is convex and that the electric field at the exit of this region is very large, Stage 2

The extraction gap stage 2 comprises the aft face of the acceleration electrode and the front face of the first Blocking electrode. The purpose of stage 2 is primarily to bring the electric field at the exit of stage 1 to zero. This is necessary as failure to do so will result in a strong ballooning of the electric field aft of the acceleration aperture. This will induce strong aberration and readjustment of the beam charge distribution leading to non-uniformity in the beam and potentially also reshaping of the meniscus away from the ideal plane, cylinder or sphere. The potential distribution in this region is obtained by solving Poisson's law backwards and assuming a non-negligible initial velocity. Again this expression is substituted into the relevant solution of Laplace's equation.

Laplace's equation, it seems, can not be solved (in the Real domain) for a boundary condition that changes convexity because this would require that the equipotentials overlap, which in terms of electrodes means that they would need to occupy the same space. In fact, this is only a major problem for the acceleration electrode and a solution is to shape the electrode so that it is the median between the two ideal cases. It should be noted that close to the beam, the two equipotentials are almost identical and that away from the beam they are not strongly disparate.

Though the outer electrodes would eventually also overlap, and in practical terms would approach each other so that the inter-electrode gap would lead to break down, Radley has indicated that the effect of the electrodes away from the beam edge is increasingly negligible. Thus as a best approximation to an ideal extractor, the outer electrodes are made to extend to just outside break-down distance and the intermediate electrode is made to be the average of the two ideal equipotentials.

Blocking Electrodes

The Extraction electrodes have accelerated the beam just beyond the desired extraction energy and have done so in such a way that the electric field at the exit of stage 2 is 0 Volts per meter. In the case were positive ions are being extracted, this means that the voltage at the exit of the Extraction region stage 2 is some negative value. The purpose of the blocking electrodes is then to bring the beam potential back up to 0V while ensuring that the electric field upon exit is 0 Volts per meter. Assuming that this Blocking potential is sufficiently high, this impedes the flow of electrons from aft of the extractor to the Extraction region.

Since the potential gradient is zero upon entry to the Blocking electrode stage 1, the standard Langmuir-Blodgett representation can be used for the beam potential. For stage 2, however, the presence of electrons can not be ignored since a population of higher energy electrons from the tail of the distribution will be able to penetrate some distance up the potential well, To solve for this distribution the relation given above is employed. This potential distribution is then substituted into the relevant solution of Laplace's equation.

Beam Neutralization

Beam neutralization is necessary aft of the extractor to compensate the considerable beam space charge. In many practical solutions, secondary electron emission from sputtering will be sufficient to provide a population of neutralizing electrons. However, if this were not the case, some electron source would be required such as a hollow cathode. In this situation emphasis should be given to ensuring that the electrons are as low energy as possible to avoid needing a large Blocking potential.

Plasma Density Range

There is a limit to how high the extraction energy can be taken as a function of density and beam form. For example, at a plasma density of $10^{14}/cm^3$, no wedge beam form can be extracted without aberration because the minimum voltage per meter required for extraction is in excess of the breakdown limit of $10^7 V/m$. At $10^{13}/cm^3$ extraction of all beam forms is possible, but for convergent beams the maximum extraction energy is capped at 20 kV in the stage 1 of the extraction region. Above this energy, the electrodes need to be too close for breakdown.

Example

Diverging Wedge Beam

For this example a 5° diverging beam is extracted through a 1 mill-meter (mm) wide, 1 meter (m) long rectangular slit. The plasma source is assumed to be a Krypton plasma of density $10^{13}$ cm$^{-3}$ at the sheath edge, The total extraction energy is 20 kV and the total blocking potential is 200V.

Extraction Gap Stage 1

The problem can be considered analogous to that of a complete cylindrical diode of curvature $r_e$=5.737 mm The current density flowing across the meniscus yields B=7.6218·10$^8$ according to equation (12). The ratio of the sheath to the pre-sheath is given by first solving equation (6) for the boundary conditions set in equation (25):

$$\beta(\gamma_m) = \frac{15^{\frac{3}{4}}}{\sqrt{\frac{9}{2}Br_m}} = 1.71827 \times 10^{-3} \quad (52)$$

and then solving equation (19) to find $\gamma_m$=1.71797×10$^{-3}$. From equation (7) R=1.00172 so that the sheath width is given by:

$$(1.00172)r_s - r_s = 9.9 \ \mu m \quad (53)$$

The gradient at the sheath edge in terms of $\gamma_m$ is $$\frac{dV}{d\gamma}(\gamma_m = 1.711827 \times 10^{-3}) = 11644 \ \text{V/unit} \quad (56)$$

Since $$\gamma = \ln\left(\frac{r}{r_s}\right), d\gamma = \frac{dr}{r},$$

which means:

$$\frac{dV}{d\gamma}(r_m) \approx \frac{1}{5.737 \times 10^{-3}} \frac{dV}{d\gamma} = 2.03 \times 10^6 \ \text{V/m}$$

According to equation (18), p=1.43557×10$^{-2}$, which is well below the limit of 0.15. Combining Table 2 with equation (20), the series expansion of g is found to be:

$$1.05846\gamma - 0.521406\gamma^2 + 0.209569\gamma^3 - 0.0738154\gamma^4 + 0.0165584\gamma^5 - 0.00157496\gamma^6 \quad (56)$$

and hence an expression for the voltage in terms of $\gamma$ through relation (13). Using the multinomial theorem, equation (56) can be written as:

$$1.0787 - 0.708501\gamma + 0.342937\gamma^2 - 0.140694\gamma^3 + 0.0419959\gamma^4 - 0.00842186\gamma^5 \quad (57)$$

Since the wedge is divergent, $\gamma = \ln(R)$, and we solve equation (44) with $$\begin{cases} R = \sqrt{\tilde{x}^2 + \tilde{y}^2} \\ \theta = \tan^{-1}\left(\frac{\tilde{y}}{\tilde{x}}\right) \end{cases} \quad (58)$$

where the non-normalized coordinates are:

$$\begin{cases} x = r_m \tilde{x} \\ y = r_m \tilde{y} \end{cases} \quad (59)$$

For the aft face of the plasma electrode we solve equation (44) for V=0. To solve for the front face of the acceleration electrode we solve for:

$$V = \frac{10.1 \ \text{kV}}{\left(\frac{9}{2}Br_m\right)^{\frac{2}{3}}} = 0.138575 \quad (60)$$

which is a direct consequence of equation (41)
Extraction Gap Stage 2

At the entry to stage 2, $V_{ext}$=10.2 kV. The solution to the g series is given by the standard Lanmuir-Blodgett relation but derived backwards. We substitute $$g = \gamma + 0.4\gamma^2 + 0.0916667\gamma^3 + 0.01424242\gamma^4 + 0.001679275\gamma^5 + 0.0001612219\gamma^6 \quad (61)$$

into equation (44), but with $$\gamma = -\ln\left(\frac{r}{r_d}\right)$$

where $r_d$ is the radius of the concentric surface at the exit of the stage. At this point in the calculation $r_d$ is unknown, but by an iterative process a value can be found such that the potential gradient at $r_a$ at the entry to the stage is equal to that of the distribution at the exit of the previous stage. We define:

$$\gamma_a = -\ln\left(\frac{r_a}{r_d}\right) \quad (62)$$

so that $$e^{-\gamma_a} = \frac{r_a}{r_d} \quad (63)$$

and:

$$r_d = r_a e^{\gamma_a} \quad (64)$$

Solving for $\gamma_a$:

$$\left.\frac{dV}{d\gamma}(\gamma_a^-)\right|_{stage\ 1} = \left.\frac{dV}{d\gamma}(\gamma_a^+)\right|_{stage\ 2} = 63586 \quad (65)$$

noting that the g series in stage 1 is different to that in stage 2. Thus $\gamma_a$=0.35464. The voltage at $\gamma_a$ is V=0.239885 according to (41).

The deceleration 1 electrode front face is calculated by solving equation (44) for V=0 and the acceleration electrode aft face is calculated by solving equation (44) for V=0.239885. It should be noted that the acceleration voltage in this gap is 17484V which is significantly higher than 10.1 kV. To achieve a total acceleration energy of exactly 20 KV, an iterative approach will be required. But since this does not benefit the illustration of the method, this will not be done here. Because the particles have an initial energy of 10.1 kV, the basic solution is shifted up by this amount.
Blocking Gap Stage 1

A blocking voltage of 200V is required so it is assumed that the voltage in this stage is 100V. The standard Langmuir-Blodgett relation is solved to determine the gap size. This yields $\gamma$=0.00712381. Then to solve for this stage replace the standard Langmuir-Blodgett relation into equation (44). For the deceleration 1 aft face V=0 is solved and for the deceleration 2 front face V=0.00137203 is solved. The final solution is shifted up by 27584V.

Blocking Gap Stage 2

The solutions for the Poisson equation with the presence of Maxwellian electrons has not been resolved. For this reason this analysis does not assume the presence of electrons.

The gradient at the entry to the stage is 18729V/unit. Again the Langmuir-Blodgett relation considered backwards is used. The gap spacing that gives a gradient of 18729V/unit at the gap entry is $\gamma=0.007196$. The normalized voltage at this point is V=0.00138794. To solve for the Deceleration 2 aft face we solve equation (44) for V=0. To solve for the ground front face equation (44) is solved for V=0.00138794.

The electrodes defined in the previous sections assumed negative ions being extracted from 0 up to 27584V. The electrodes for the extraction of positive ions are identical except that the polarity of the field is reversed. In this scheme, ions are extracted from 27584V down to 0V.

To summarize, the process of determining the electrode shapes, positions and potentials to provide a minimum-aberration, high brightness beam involves the solution to a multiple boundary value problem. First, the designer selects the desired beam type to be implemented. As noted, the symmetrical beams considered include parallel, diverging and converging rectangular, cylindrical and spherical beams. The designer specifies the extraction energy. This gives the potential on the plasma electrode. The designer also specifies the total beam current and the beam current density. This information yields the plasma density, area of the plasma electrode aperture, and radius of curvature for the meniscus.

Then, one computes the electric field at the meniscus. Thus, the voltage and electric field at the first concentric surface is specified. Now the designer selects a first value for the potential at the second concentric surface. With these boundary conditions, one can determine the potential distribution between the first and second surfaces. From the potential distribution one can compute the electric field at the second surface. One also learns from applying the boundary conditions the radial distance between the first and second surface.

Next we impose the boundary condition that the electric field at the third surface is zero. We choose a relatively small voltage for the potential of the first blocking electrode. Using the first value selected for the potential at the second surface in conjunction with the specified boundary conditions at the third electrode, we determine a potential distribution between the second and third surfaces. From the potential distribution we can determine the electric field at the second surface. We compare this to the previously determined electric field at the second surface. To the extent the two values are not equal, the selected potential for the second surface must be adjusted. Thus, we iteratively select a potential for the second surface until we find the value that results in continuity of the electric field at the second surface. Note that the solution of the boundary conditions also gives the positions of the first three surfaces. Further, once the potential distributions are known, the shapes of the electrodes can be determined.

Note the differences between the three electrode system of the present invention and the three electrode system of the prior art. In the three electrode system of the prior art, the first stage is an acceleration stage and the second stage is a blocking stage. The electric field is not brought to a very low value at the aperture of the third electrode. In the present invention, the first stage is an acceleration stage that brings the electric field to a very high value at the second electrode. The second stage is a deceleration stage, which serves to bring the electric field to a very low value, preferably zero, at the aperture of the third electrode. In the absence of electrons, a three-electrode system, designed as described herein, is sufficient to produce a zero emittance growth beam.

Note that the electric field at the second surface is very large. It is several orders of magnitude greater than the electric field at the meniscus. Thus, even if the electric field is not completely brought to zero at the aperture of the third surface, a substantial reduction in the electric field there will result in a low emittance growth beam. For example, the electric field can be brought to less than 10 kV/m (kilo-Volts per meter) which is several orders of magnitude less than the electric field at the aperture of the second electrode and at least about an order of magnitude less than the field at the meniscus. Indeed, the electric field can brought to a value substantially smaller than the electric field at the meniscus. Clearly, the closer the electric field is to zero at the aperture of the third electrode, the lower the emittance growth. Thus, ideally, the electric field is brought substantially to zero. Simulations, using finite element software, predict that zero emittance growth can be achieved using the methods described herein.

In the presence of electrons, more than three electrodes are required. Thus, in one embodiment, two additional electrodes are provided to form a blocking region with two stages. The design of the blocking stage, which includes the aft face of the third electrode, is similar to the design of the first three electrodes just described. We start with the boundary conditions at the third electrode specified above. We select a potential for the fourth electrode and determine the potential distribution between the third and fourth surfaces. Then we compute the potential distribution between the fourth and fifth surfaces resulting from the boundary conditions of zero volts and zero electric field at the fifth surface. When the potential distributions produce equal electric fields at the fourth surface, the problem is solved, and a low-emittance beam is produced that exhibits an electric field magnitude at the fifth electrode aperture that is substantially less than the electric field magnitude at the meniscus. Ideally, the electric field magnitude at the fifth electrode aperture is zero.

Thus, the method of the present invention enables design of a three or five electrode system with low emittance growth. A four electrode system can also be designed. In the four electrode system, the first three electrode shapes, positions and potentials can be determined as described above. The fourth electrode can be designed as a blocking electrode forming a single blocking stage between the third and fourth surfaces. Indeed, using the methodology disclosed herein plasma extraction mechanisms can be designed with other numbers of electrodes and with other potential distributions. The method of the present invention is not restricted to ion plasma sources but is applicable to form a charged particle beam from a charged particle source generally.

Embodiments of the present invention can produce from a plasma ion source beams having brightnesses of greater than $10^5$ A/sr/m$^2$. The embodiments described above are designed to result in little or no emittance growth. Skilled persons will understand, that in some applications, the emittance may be less importance, and some emittance growth can be tolerated. In such cases, one can depart from the ideal teachings of the above embodiments without departing from the concepts of the invention. For example, where the ideal teaching produces zero electric field, a finite electric field that is substantially smaller than the electric field at the meniscus could be tolerated in some embodiments and still provide substantial benefit over the prior art. For example, an electric field of less than 5 percent, less than 10 percent, less than 15 percent, less than 20 percent, or even less than 30 percent or more of the maximum field at the meniscus could be tolerated in embodiments, and such fields could be considered to be substantially smaller than the field at the meniscus. Similarly, a field that is "substantially zero" is one in that is very small in relation to the meniscus field, and that results in very little emittance growth. Similarly, while it is ideal that the equipotential surface in the vicinity of the last electrode be parallel or concentric to the meniscus, some deviations from parallelism or concentricity can be tolerated in embodiments in which more emittance growth can be tolerated.

The electric field is preferably small enough, and the parallelism or concentricity preferably sufficient, to produce a beam having an emittance small enough to be focused to a submicron, or more preferably a sub-tenth-micron spot, and having sufficient current to be used to etch in applications such as circuit edit and mask repair.

Although the present invention and its advantages have been described in detail, it should be understood that various changes, substitutions and alterations can be made herein without departing from the spirit and scope of the invention as defined by the appended claims. The invention achieves multiple objectives and because the invention can be used in different applications for different purposes, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An charged particle beam apparatus, comprising:
a vacuum chamber;
a stage for positioning a work piece within the vacuum chamber;
a plasma ion source for generating a plasma, the plasma source having a high brightness;
one or more extractor electrodes for extracting ions from the plasma to form a beam;
an ion beam focusing column for focusing the extracted ions onto a sub-micron spot on work piece; and
a scanning electron microscope for forming a beam of electrons in the vacuum chamber for observing the work piece.

2. The charged particle beam apparatus of claim 1 in which the plasma ion source has a brightness of greater than $10^5$ A/sr/m$^2$.

3. The charged particle beam apparatus of claim 1 in which the ion beam focusing column focuses the ion beam into a sub-tenth-micron spot.

4. The charged particle beam apparatus of claim 3 in which the plasma ion source has a brightness of greater than $10^5$ A/sr/m$^2$.

5. The charged particle beam apparatus of claim 1 in which an electric field at an exit aperture of the sequence of electrodes is less than 30 percent of the electric field at the meniscus.

6. The charged particle beam apparatus of claim 1 in which the one or more electrodes include a first, second and third electrode each with an aperture through which the charged particle beam flows, each exhibiting an electric potential and a shape to produce a beam with substantially concentric equipotential surfaces.

7. A method of ion milling or imaging, comprising:
extracting ions from a plasma ion source having a brightness of greater than $10^5$ A/sr/m$^2$;
focusing the ions onto a submicron spot on a work piece in a vacuum chamber; and
deflecting the beam to trace out a pattern on the surface of the work piece to mill or deposit a pattern on the work piece.

8. The method of claim 7 further comprising observing the work piece in the vacuum chamber using a scanning electron microscope.

9. The method of claim 7 in which focusing the ions onto a submicron spot on a work piece includes focusing the ions into a sub-one-tenth-micron spot.

10. The method of claim 7 further comprising forming an image from secondary particles emitted upon impact of the ion beam on the sample.

11. The method of claim 7 in which deflecting the beam to trace out a pattern on the surface of the work piece to mill a pattern on the work piece includes editing a circuit on the work piece.

12. The method of claim 7 in which deflecting the beam to trace out a pattern on the surface of the work piece to mill a pattern on the work piece includes repairing a mask.

* * * * *